US012625206B2

(12) United States Patent　(10) Patent No.: US 12,625,206 B2
Yoshii et al.　(45) Date of Patent: May 12, 2026

(54) DIGITIZING DEVICE AND DIGITIZING METHOD

(71) Applicants: SUMIDA CORPORATION, Tokyo (JP); Kyoto University, Kyoto (JP)

(72) Inventors: Yoshiharu Yoshii, Miyagi (JP); Tsunaki Kaneko, Miyagi (JP); Norikazu Mizuochi, Kyoto (JP); Izuru Ohki, Kyoto (JP)

(73) Assignees: SUMIDA CORPORATION (JP); Kyoto University (JP)

( * ) Notice: Subject to any disclaimer, the term of this patent is extended or adjusted under 35 U.S.C. 154(b) by 140 days.

(21) Appl. No.: 18/700,602

(22) PCT Filed: Sep. 20, 2022

(86) PCT No.: PCT/JP2022/034963
§ 371 (c)(1),
(2) Date: Apr. 11, 2024

(87) PCT Pub. No.: WO2023/089942
PCT Pub. Date: May 25, 2023

(65) Prior Publication Data
US 2024/0418809 A1　Dec. 19, 2024

(30) Foreign Application Priority Data

Nov. 19, 2021　(JP) ................................. 2021-188929

(51) Int. Cl.
*G01R 33/36*　(2006.01)
*B82Y 15/00*　(2011.01)
(Continued)

(52) U.S. Cl.
CPC .......... *G01R 33/3621* (2013.01); *B82Y 15/00* (2013.01); *B82Y 20/00* (2013.01);
(Continued)

(58) Field of Classification Search
CPC ................ G01R 33/3621; G01R 33/26; G01R 19/2509; G01R 33/323; B82Y 15/00;
(Continued)

(56) References Cited

U.S. PATENT DOCUMENTS

| | | | |
|---|---|---|---|
| 10,338,162 B2 * | 7/2019 | Reynolds ................ | G01R 33/26 |
| 10,359,479 B2 * | 7/2019 | Manickam ............. | G01N 24/10 |

(Continued)

FOREIGN PATENT DOCUMENTS

| | | |
|---|---|---|
| JP | 2008-039641 A | 2/2008 |
| JP | 2011-101776 A | 5/2011 |

(Continued)

OTHER PUBLICATIONS

International Search Report of the International Searching Authority issued in PCT/JP2022/034963, mailed Nov. 8, 2022; ISA/JP (5 pages).

*Primary Examiner* — Christopher P McAndrew
(74) *Attorney, Agent, or Firm* — Harness, Dickey & Pierce, P.L.C.

(57)　ABSTRACT

A physical field generator generates a magnetic field or an electric field corresponding to an input signal. An optical quantum sensor part generates light corresponding to the magnetic field or the electric field by a sensing member and converts the light into an electrical signal as a sensor signal by a photoelectric element. An analog/digital converter digitizes the sensor signal. Further, the optical quantum sensor part performs a quantum operation with respect to the sensing member mentioned above and causes the sensing member mentioned above to generate the light mentioned above corresponding to the magnetic field or the electric field mentioned above.

5 Claims, 4 Drawing Sheets

(51) Int. Cl.
     *B82Y 20/00*      (2011.01)
     *G01R 33/26*      (2006.01)
     *H03M 1/08*      (2006.01)

(52) U.S. Cl.
     CPC .......... *G01R 33/26* (2013.01); *H03M 1/0854*
              (2013.01); *H03M 1/089* (2013.01)

(58) Field of Classification Search
     CPC ..... B82Y 20/00; H03M 1/0854; H03M 1/089;
              H03M 1/08; H03M 1/124
     USPC ......................................................... 324/304
     See application file for complete search history.

(56)            References Cited

U.S. PATENT DOCUMENTS

| | | | |
|---|---|---|---|
| 10,371,765 B2 * | 8/2019 | Kaup | G01C 21/20 |
| 10,677,953 B2 * | 6/2020 | Stetson | G01V 3/101 |
| 10,901,054 B1 * | 1/2021 | Chen | G01R 33/26 |
| 11,360,174 B2 * | 6/2022 | Lukin | G01R 33/54 |
| 11,933,865 B2 * | 3/2024 | Yoshii | G01R 33/24 |
| 2014/0374622 A1 | 12/2014 | Cronin et al. | |
| 2016/0061914 A1 | 3/2016 | Jelezko et al. | |
| 2017/0234795 A1 | 8/2017 | Issadore et al. | |
| 2020/0025835 A1 | 1/2020 | Pham et al. | |
| 2020/0072915 A1 * | 3/2020 | Zhou | G01N 21/65 |
| 2020/0166592 A1 * | 5/2020 | Ibragimova | G01R 33/3808 |

FOREIGN PATENT DOCUMENTS

| | | |
|---|---|---|
| JP | 2015-508494 A | 3/2015 |
| JP | 2020-180976 A | 11/2020 |
| JP | 2021-103093 A | 7/2021 |

\* cited by examiner

DIGITIZING DEVICE AND DIGITIZING METHOD

CROSS REFERENCE TO RELATED APPLICATIONS

This application is a 371 U.S. National Phase of International Application No. PCT/JP2022/034963, filed on Sep. 20, 2022, which claims priority to Japanese Patent Application No. 2021-188929, filed Nov. 19, 2021. The entire disclosures of the above applications are incorporated herein by reference.

BACKGROUND

Technical Field

The present invention relates to a digitizing device and a digitizing method.

Related Art

In general, when a minute analog signal that is obtained via various sensors and sensing devices is digitized by using an A/D (Analog/Digital) converter, the analog signal is voltage-amplified by an amplifier circuit using an active element such as a transistor. Thereafter, the analog signal after the voltage amplification is input to the A/D converter (refer to, for instance, Patent Documents 1 and 2).

Because quantization noise corresponding to the number of quantization bits and thermal noise that is caused by an electronic circuit and so on are usually generated in an A/D converter, it is difficult to accurately digitize a minute analog signal having a level that is similar to or lower than a level of the above noises without the voltage amplification in the A/D converter. Therefore, as described above, it is necessary to amplify a minute analog signal by an amplifier circuit.

PRIOR ART DOCUMENTS

Patent Documents

Patent Document 1: Japanese Patent Publication Number 2008-039641.

Patent Document 2: Japanese Patent Publication Number 2011-101776.

However, as described above, even when a minute analog signal is amplified by an amplifier circuit at the preceding stage of an A/D converter, noise (such as thermal noise) peculiar to the amplifier circuit is generated. Because the noise floor of this amplifier circuit is generally higher than the noise floor of the A/D converter, it is difficult to accurately digitize the minute analog signal having a level that is similar to or lower than the noise level of the A/D converter.

The present invention attempts to solve the above problems. An object of the present invention is to obtain a digitizing device and a digitizing method that accurately digitize a minute analog signal having a level that is similar to or lower than a noise floor of an A/D converter.

SUMMARY

A digitizing device according to the present invention has a physical field generator, an optical quantum sensor part, and an analog/digital converter. Specifically, the physical field generator generates a magnetic field or an electric field corresponding to an input signal. The optical quantum sensor part generates light corresponding to the magnetic field or the electric field by a sensing member and converts the light into an electrical signal as a sensor signal by a photoelectric element. The analog/digital converter digitizes the sensor signal. Further, the optical quantum sensor part performs a quantum operation with respect to the above-mentioned sensing member so as to cause the above-mentioned sensing member to generate the above-mentioned light corresponding to the above-mentioned magnetic field or electric field.

The digitizing method according to the present invention has steps and an optical quantum sensing step. Specifically, in the step, a magnetic field or an electric field corresponding to an input signal is generated. In the optical quantum sensing step, light corresponding to the magnetic field or the electric field is generated by a sensing member and the light is converted into an electrical signal as a sensor signal by a photoelectric element. In the step, the sensor signal is digitized by an analog/digital converter. Further, in the optical quantum sensing step, a quantum operation is performed with respect to the above-mentioned sensing member so as to cause the above-mentioned sensing member to generate the above-mentioned light corresponding to the above-mentioned magnetic field or electric field.

Effects of the Invention

According to the present invention, it is possible to obtain a digitizing device and a digitizing method that accurately digitize a minute analog signal having a level that is similar to or lower than a noise floor of an A/D converter.

DETAILED DESCRIPTION

Embodiments of the present invention will be explained below with reference to the drawings.

First Embodiment

Figure 1:
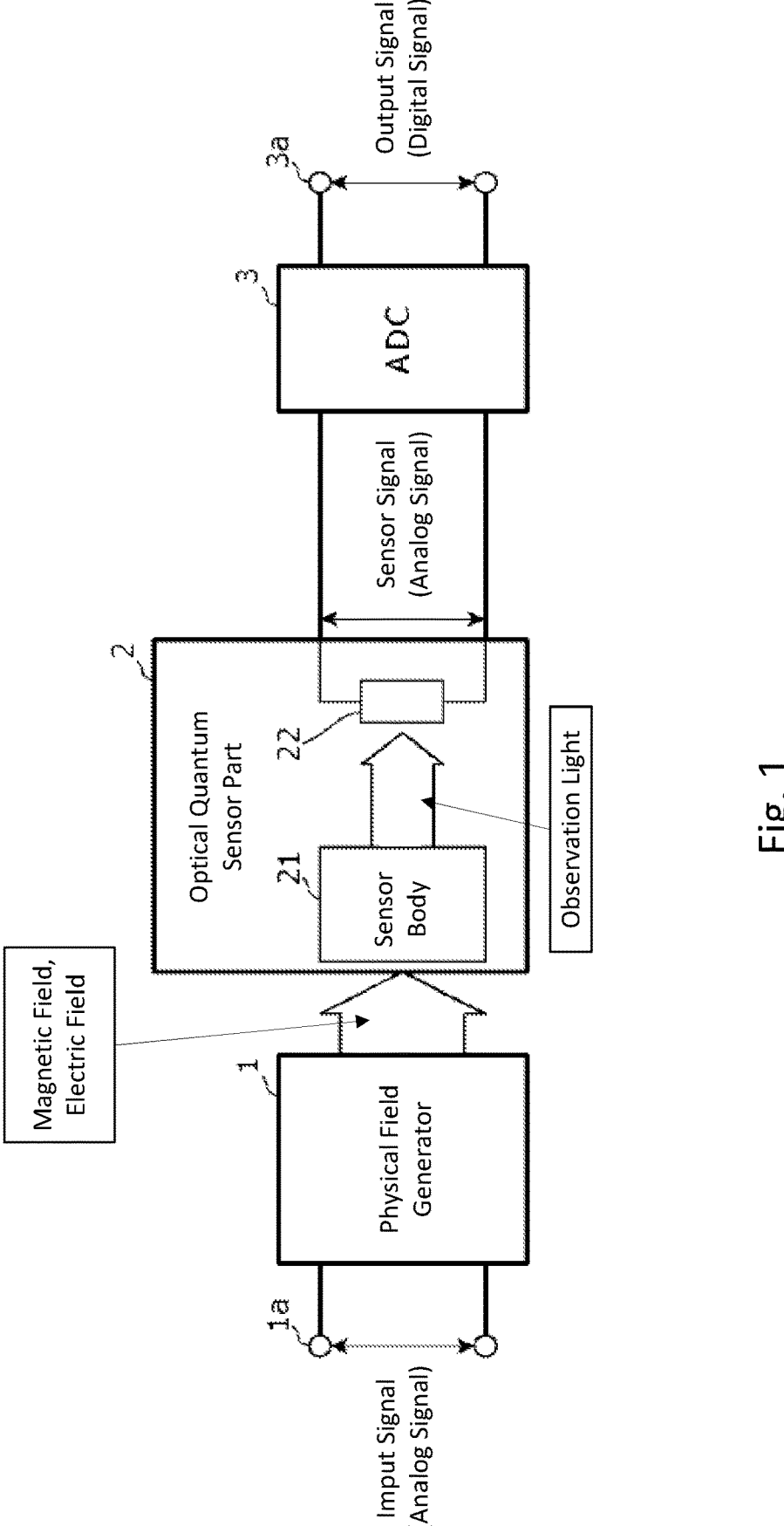
FIG. 1 is a block diagram that shows a configuration of a digitizing device according to an embodiment of the present invention.

FIG. 1 is a block diagram that shows a configuration of a digitizing device according to an embodiment of the present invention. The digitizing device shown in FIG. 1 has a physical field generator 1, an optical quantum sensor part 2 and an analog/digital converter (A/D converter, ADC) 3.

The physical field generator 1 generates a magnetic field corresponding to an input signal (electric signal) that is input via an input terminal 1a of the physical field generator 1. For instance, the physical field generator 1 generates the magnetic field using a conductive coil or conductive wiring.

Note that this input signal may be an AC signal with a single frequency, an AC signal with a predetermined period having a plurality of frequency components, or a DC signal. That is, the above-mentioned magnetic field is such as an AC magnetic field with a single frequency, an AC magnetic field with a predetermined period having a plurality of frequency components, or a DC magnetic field, according to the input signal. Similarly, the above-mentioned electric field is, such as an AC electric field with a single frequency, an AC electric field with a predetermined period having a plurality of frequency components, or a DC electric field, according to the input signal.

The optical quantum sensor part 2 has a sensor body 21 and a photoelectric element 22. In the sensor body 21, a sensing member generates light (observation light) corresponding to the magnetic field that is generated by the physical field generator 1 and the photoelectric element 22 converts the light into an electrical signal as a sensor signal. The photoelectric element 22 is, for instance, a photodiode or a phototransistor and generates a sensor signal corresponding to intensity of the entered observation light.

Specifically, the optical quantum sensor part 2 (specifically, the sensor body 21) performs a quantum operation on the sensing member so that the sensing member generates the light corresponding to the magnetic field that is generated by the physical field generator 1.

In the first embodiment, the optical quantum sensor part 2 (specifically, the sensor body 21) performs the quantum operation on the sensing member according to an optically detected magnetic resonance measuring method (ODMR) so that the sensing member generates the above-mentioned observation light.

Figure 2:
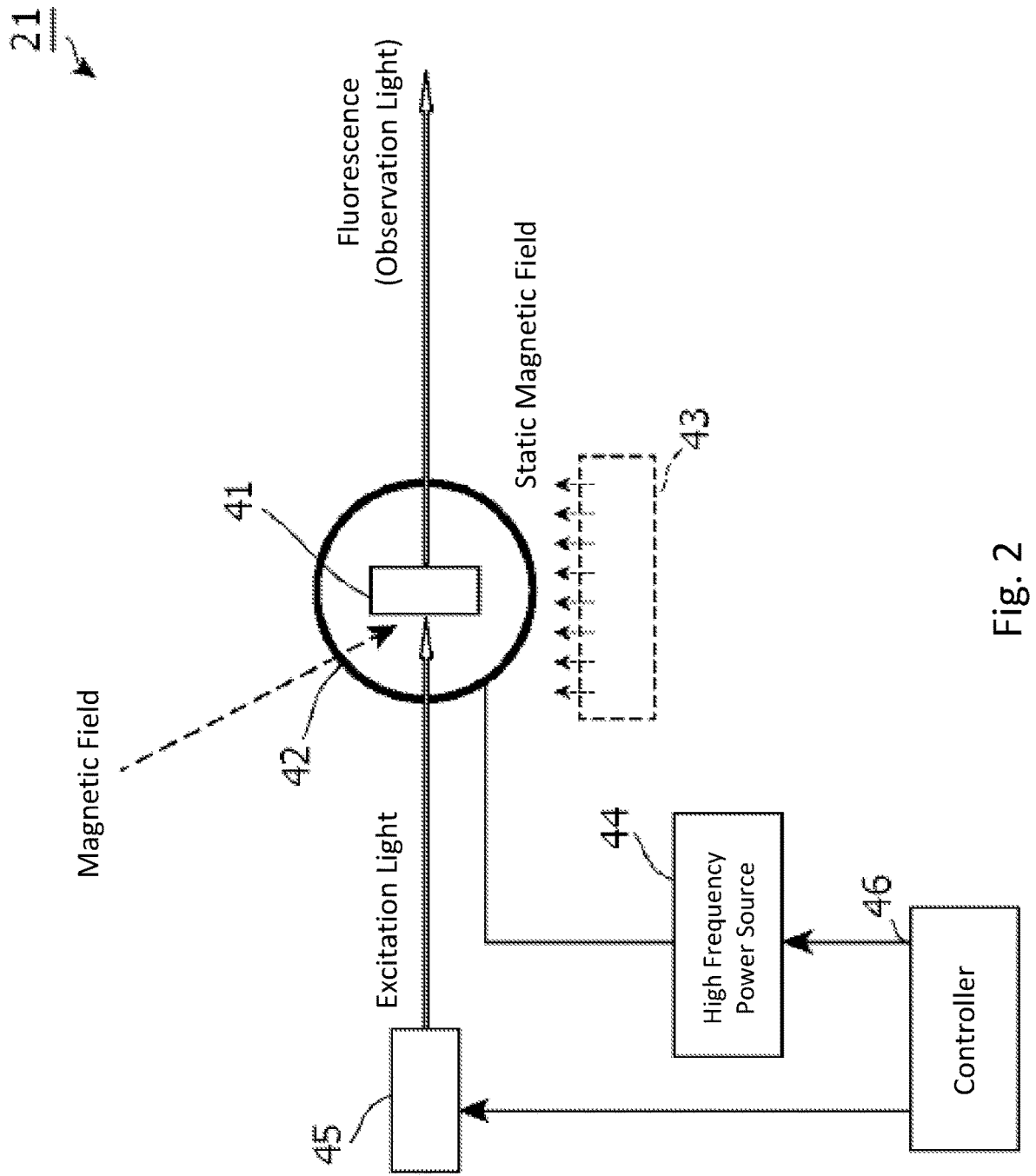
FIG. 2 is a diagram that shows a configuration of a sensor body 21 in the digitizing device according to a first embodiment.

FIG. 2 is a diagram that shows the configuration of the sensor body 21 in the digitizing device according to the first embodiment. In the first embodiment, for the ODMR, for instance, as shown in FIG. 2, the sensor body 21 has a magnetic resonance member 41 as the sensing member, a high frequency magnetic field generator 42, a magnet 43, a high frequency power source 44, a light emitting device 45, and a controller 46.

The magnetic resonance member 41 has a crystal structure. The electron spin quantum state changes in correspond with the magnetic field that is generated by the physical field generator 1, and at the same time, the magnetic resonance member 41 is a member capable of an electron spin quantum operation by a microwave (based on Rabi vibration) at a frequency that corresponds to a defect in a crystal lattice and an arrangement direction of impurities. That is, the magnetic resonance member 41 is placed within the above-mentioned magnetic field.

In this embodiment, the magnetic resonance member 41 is an optically detected magnetic resonance member having a plurality (that is, an ensemble) of specific color centers. This specific color center has an energy level capable of Zeeman splitting, and at the same time, can take a plurality of directions in which shift widths of the energy level at the time of Zeeman splitting are different from each other.

Here, the magnetic resonance member 41 is a member such as a diamond that includes a plurality of NV (Nitrogen Vacancy) centers as a specific color center of a single category (or type). In the case of the NV center, a ground state is a triplet state of ms=0, +1, −1 and a level of ms=+1 and a level of ms=−1 undergo Zeeman splitting. When the NV center transitions from an excited state at the levels of ms=+1 and ms=−1 to the ground state, the NV center is accompanied by fluorescence at a predetermined proportion and the remaining proportion of the NV center transitions from the excited state (ms=+1 or ms=−1) to the ground state (ms=0) with non-radiation.

Note that the color center included in the magnetic resonance member 41 may be a color center other than the NV center.

The high frequency magnetic field generator 42 applies a microwave to the magnetic resonance member 41 so as to perform an electron spin quantum operation of the magnetic resonance member 41. For instance, the high frequency magnetic field generator 42 is a plate-shaped coil and has a substantially circular coil part that emits the microwave and terminal parts that extend from both ends of the coil part and are fixed to a substrate. The high frequency power source 44 generates a current of the microwave and is conductively connected to the high frequency magnetic field generator 42. The coil part conducts two currents that are mutually in parallel at a predetermined interval so as to sandwich the magnetic resonance member 41 at both end surface parts of the coil part and emit the above-mentioned microwave. Here, the coil part is the plate-shaped coil, however, because the current of the microwave flows through the end surface part of the coil part due to a skin effect, two currents are formed. As a result, the microwave with a substantially uniform intensity is applied to the magnetic resonance member 41.

In the case of the NV center, since the color center is formed by a defect (vacancy) (V) and nitrogen (N) as an impurity in the diamond crystal, there are four possible positions for adjacent nitrogen (N) with respect to the defect (vacancy) (V) in the diamond crystal (that is, the arrangement directions of a pair of the vacancy and the nitrogen). Sub-levels (that is, the energy level from the ground) after Zeeman splitting respectively corresponding to these arrangement directions are different from each other. Therefore, in a characteristic of a fluorescence intensity after Zeeman splitting due to a static magnetic field with respect to a frequency of the microwave, in correspond with each direction i (i=1, 2, 3, 4), four pairs of dip frequencies (fi+, fi−) that are different from one another appear. Here, the above-mentioned frequency of the microwave (wavelength) is set in correspond with any of the dip frequencies of these four pairs of dip frequencies.

Further, the magnet 43 applies a static magnetic field (a DC magnetic field) to the magnetic resonance member 41 so that the energy levels of a plurality of specific color centers (here, a plurality of NV centers) in the magnetic resonance member 41 undergo Zeeman splitting. Here, the magnet 43 is a ring-type permanent magnet, such as a ferrite magnet, an alnico magnet, or a samarium cobalt magnet. Further, the magnet 43 may be an electromagnet.

Further, in the magnetic resonance member 41, as the arrangement direction of the above-mentioned defects and impurities is substantially coincident with the above-mentioned direction of the static magnetic field (and the direction of the applied magnetic field), the crystal of the magnetic resonance member 41 is formed and the direction of the magnetic resonance member 41 is set.

Furthermore, in this embodiment, in order to irradiate the magnetic resonance member 41 with excitation light, an optical system (not shown) from the light emitting device 45 to the magnetic resonance member 41 is provided. Further, in order to detect fluorescence (the observation light) from the magnetic resonance member 41, an optical system (not shown) from the magnetic resonance member 41 to the photoelectric element 22 is provided.

The observation light is concentrated toward the photoelectric element 22 by an optical system such as a compound parabolic concentrator (CPC). For instance, the magnetic resonance member 41 is arranged on the CPC, and among the fluorescence that is emitted in all directions from a color center in the magnetic resonance member 41, the fluorescent that is emitted in a wide solid angle (for instance, more than a predetermined percentage of all directions) by this optical system is concentrated.

The light emitting device 45 has such as a laser diode as a light source and the light source emits a laser beam (laser light) of a predetermined wavelength as excitation light to be irradiated to the magnetic resonance member 41.

According to a predetermined measurement sequence, the controller 46 (*a*) controls the high frequency power source 44 and the light emitting device 45, performs a quantum operation using the microwave and the laser light mentioned above, causes the sensor body 21 to generate the observation light, and causes the photoelectric element 22 to generate the sensor signal. For instance, the controller 46 has a computer that operates according to a control program. The computer has a CPU (Central Processing Unit), a ROM (Read Only Memory), a RAM (Random Access Memory), etc., and performs the above-mentioned operations (or processes) by loading the control program into the RAM and executing it on the CPU.

Figure 3:
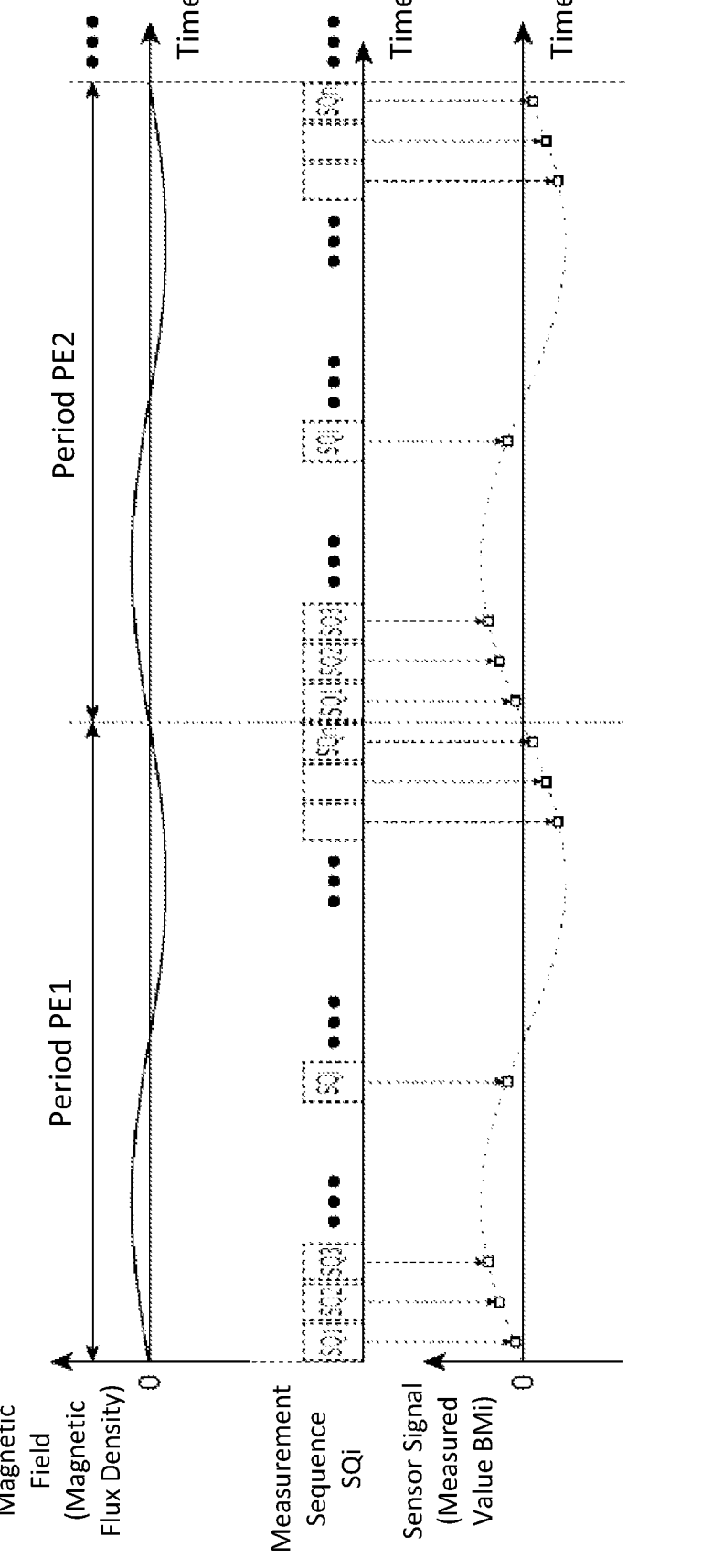
FIG. 3 is a diagram that explains an example of a sensor signal in the digitizing device according to the first embodiment.

FIG. 3 is a diagram that explains an example of a sensor signal in the digitizing device according to the first embodiment. This measurement sequence is set according to such as the frequency of the above-mentioned magnetic field. For instance, when the input signal is an AC signal with a relatively low frequency, as shown in FIG. 3, with Ramsey pulse sequence (that is, the measurement sequence SQ1-SQn in the DC magnetic field) during one cycle, the measurement of the above-mentioned magnetic field corresponding to the input signal is performed a plurality of times (n times), and the measured values BM1-BMn are obtained as the sensor signals. As a result, the sensor signal at the level corresponding to the magnetic field strength at the time of each measurement sequence is generated.

Further, for instance, when the above-mentioned magnetic field is an AC magnetic field with a relatively high frequency, a spin echo pulse sequence (for instance, Hahn echo sequence) may be applied to the measurement sequence. However, the measurement sequence is not limited to these sequences. For instance, when the period of the above-mentioned magnetic field is equal to or longer than a T2 relaxation time, the magnetic field measurements are performed the plurality of times with Ramsey pulse sequence as mentioned above. When the period of the above-mentioned magnetic field is shorter than the T2 relaxation time, the spin echo pulse sequence (for instance, Hahn echo sequence) may be applied. Furthermore, when the period of the above-mentioned magnetic field is shorter than ½ of the T2 relaxation time, the magnetic field measurement may be performed according to a Qdyne method.

Refer back to FIG. 1, the A/D converter 3 digitizes the above-mentioned sensor signal (without digitizing the input signal). As a result, the A/D converter 3 generates a digital signal as an output signal corresponding to the input signal and outputs it via an output terminal 3a of the A/D converter 3.

In this embodiment, in particular, the optical quantum sensor part 2 (specifically, the sensor body 21) causes the sensing member to generate the above-mentioned observation light in a state in which the level of the sensor signal exceeds the noise floor (for instance, thermal noise or 1/f noise of the transistor used in the A/D converter 3) of the A/D converter 3.

Here, the level (amplitude) of the sensor signal changes according to a factor, such as the efficiency of the sensing member (in the first embodiment, for instance, the type or the number of the color centers in the magnetic resonance member 41), the light concentration efficiency of the observation light (in the first embodiment, the amount of the entered light to the photoelectric element 22 relative to the light emission amount of the color center), or the conversion efficiency of the photoelectric element 22 (the level of the sensor signal relative to the amount of the entered light). Therefore, according to the noise floor (already known) of the A/D converter 3, the value(s) of the factor(s) is determined so that the level of the sensor signal exceeds the noise floor of the A/D converter 3. As a result, for instance, the sensitivity of the optical quantum sensor part 2 is set to 1.5 $PT/Hz^{1/2}$ or more.

Further, in general, the noise of an A/D converter includes quantization noise and thermal noise, and in a high-resolution A/D converter, the thermal noise is more dominant than the quantization noise. The A/D converter 3 in this embodiment is a high-resolution A/D converter and the value(s) of the above-mentioned factor(s) is determined so that the level of the sensor signal exceeds the noise level of thermal noise.

Further, a reference voltage of the A/D converter 3 is set according to a range (a minimum level value and a maximum level value) of the sensor signal. Further, by lowering the reference voltage of the A/D converter, the quantization noise is reduced, however, the thermal noise is not reduced.

Note that a level (or a range) of the input signal and the electromagnetic conversion efficiency of the physical field generator 1 are already known.

Furthermore, in this embodiment, in particular, the digitizing device does not have an amplifier circuit, in which the sensor signal is electrically amplified, between the photoelectric element 22 and the A/D converter 3. Furthermore, in this embodiment, an amplifier circuit in which the input signal is electrically amplified, is not provided between a signal source of the input signal and the physical field generator 1. That is, in this embodiment, an electrical amplification circuit that is a noise source is not provided at an upstream side of the A/D converter 3. Because the thermal noise is generated and amplified in such the amplifier circuit in the same way as the A/D converter 3, the noise is superposed on a signal that is input to the A/D converter 3. Therefore, it is preferred that an amplifier circuit is not provided as mentioned above.

Further, the high frequency power source 44 and the controller 46 are electrically separated from the A/D converter 3 so as to prevent the electrical noise that is generated by the high frequency power source 44 and the controller 46 from invading (inputting) into the A/D converter 3.

Next, operations of the digitizing device according to the first embodiment will be explained.

When the input signal is applied to the physical field generator 1, a magnetic field with an intensity corresponding to the level of the input signal is generated in the physical field generator 1 and is applied to the sensor body 21 of the optical quantum sensor part 2.

In the sensor body 21, the measurement sequence is executed as mentioned above, and the light having a light quantity corresponding to the strength of the magnetic field is generated. In the first embodiment, according to the ODMR, the magnetic resonance member 41 generates the light having the light quantity corresponding to the strength of the magnetic field.

Thereafter, the photoelectric element 22 receives the light, generates the sensor signal having the level corresponding to the light quantity of the received light, and outputs the sensor signal to the A/D converter 3.

The A/D converter 3 digitizes the sensor signal, generates the digital signal corresponding to the input signal, and outputs the digital signal as the output signal.

As described above, according to the first embodiment, the physical field generator 1 generates a magnetic field corresponding to the input signal. The optical quantum sensor part 2 generates light corresponding to the magnetic field by the sensing member and converts the light into the electrical signal as the sensor signal by the photoelectric element. The A/D converter 3 digitizes the sensor signal. Further, the optical quantum sensor 2 performs the quantum operation on the above-mentioned sensing member so as to cause the above-mentioned sensing member to generate the above-mentioned light corresponding to the above-mentioned magnetic field.

As a result, since a relatively high-level sensor signal, instead of the minute input signal, is digitized, the digital signal corresponding to the input signal can be accurately obtained. Therefore, the minute analog signal having the level that is similar to or lower than the noise level of the A/D converter 3 is accurately digitized.

Second Embodiment

In a second embodiment, the optical quantum sensor part 2 performs a quantum operation with respect to the sensing member according to an optically pumped atomic magnetic force measuring method (OPAM) instead of the ODMR and causes the sensing member to generate the light corresponding to the magnetic field.

Figure 4:
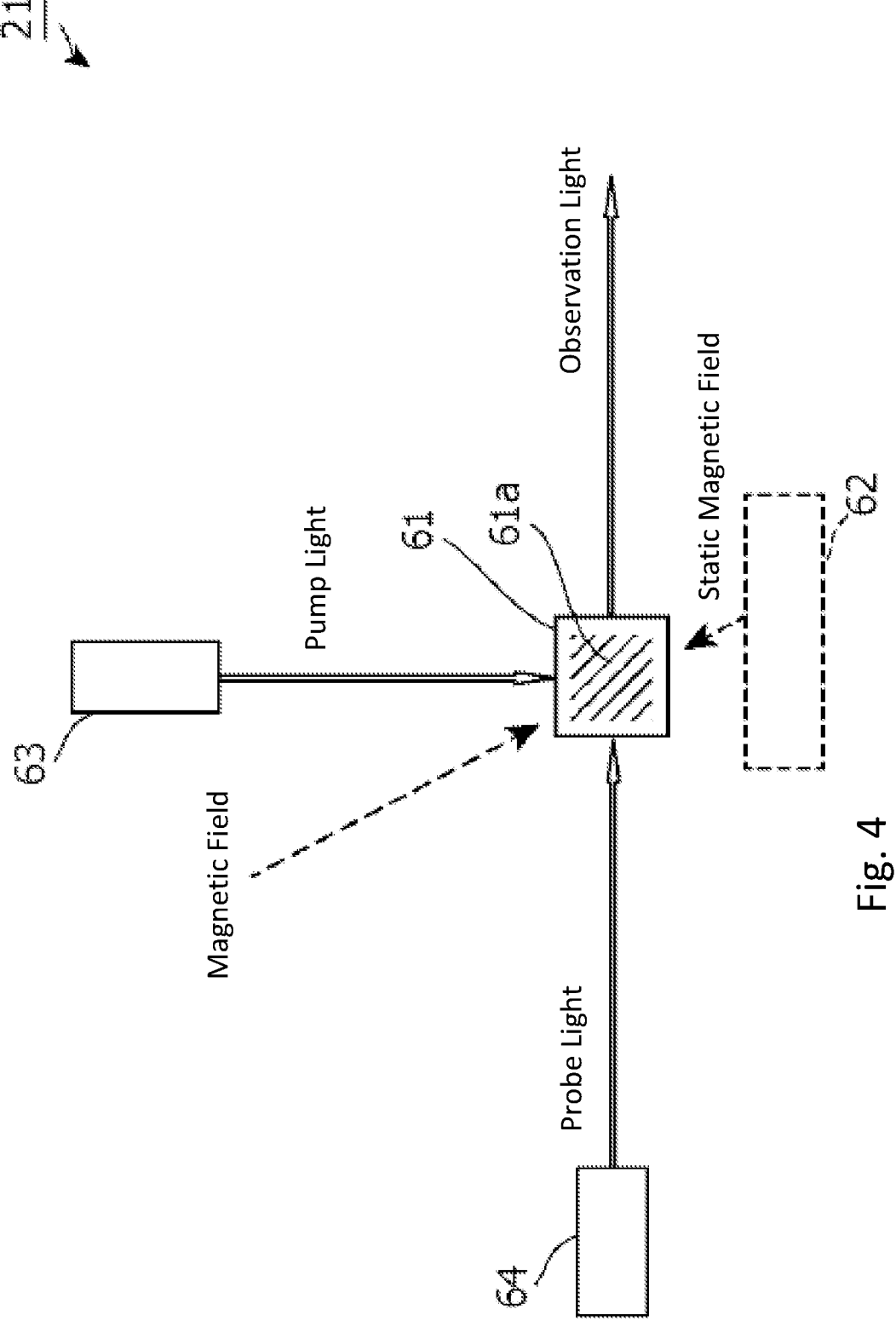
FIG. 4 is a diagram that shows a configuration of a sensor body 21 in a digitizing device according to a second embodiment.

FIG. 4 is a diagram that shows a configuration of a sensor body 21 in a digitizing device according to the second embodiment. In the second embodiment, the sensor body 21 has a cell 61, a magnet 62, and light emitting devices 63 and 64 for the OPAM.

The cell 61 is such as a transparent (permeable or transmissible) glass cell. Alkali metal atoms (for instance, K, Rb, Cs) as a sensing member 61*a* are sealed along with buffer gas in the cell 61. The magnet 62 is a magnet that applies static magnetism to the sensing member and may be the above-mentioned permanent magnet or an electromagnet.

The light emitting device 63 generates pump light and irradiates the pump light to the sensing member 61*a*. The light emitting device 64 generates probe light and irradiates the probe light to the sensing member 61*a*. In an OPAM measurement sequence, a spin polarization is generated in the sensing member by optical pumping of the pump light and a rotation of the spin polarization corresponding to the magnetic field is measured by a magnetic optical rotation of the probe light. Specifically, a deflection rotation angle of an observation light (that is, the probe light after the magnetic optical rotation) is detected. The deflection rotation angle of the observation light is detected by a plurality of photoelectric elements 22 using such as a four-detector method. When the deflection rotation angle is detected by the plurality of photoelectric elements 22, an arithmetic processing (for instance, a difference calculation) may be performed after sensor signals are respectively digitized by a plurality of A/D converters 3 to become a plurality of digital signals.

Note that the other configurations and operations of the digitizing device according to the second embodiment are the same as those explained in the first embodiment. Therefore, the explanations of the other configurations and operations of the digitizing device according to the second embodiment will be omitted.

Third Embodiment

In a third embodiment, the optical quantum sensor part 2 performs a quantum operation with respect to a sensing member and causes the sensing member to generate light corresponding to an electric field. In the third embodiment, the physical field generator 1 generates the electric field corresponding to an input signal (electrical signal) that is input via the input terminals 1*a* of the physical field generator 1. The optical quantum sensor part 2 causes the sensing member to generate the light (observation light) corresponding to the electric field that is generated by the physical field generator 1 in the sensor body 21 and causes the photoelectric element 22 to convert the light into an electrical signal as a sensor signal.

For instance, the physical field generator 1 generates the electric field using a pair of electrode plates. Further, this input signal may be an AC signal with a single frequency, an AC signal with a predetermined period having a plurality of frequency components, or a DC signal. That is, the above-mentioned electric field is, such as an AC electric field with a single frequency, an AC electric field with a predetermined period having a plurality of frequency components, or a DC electric field, according to the input signal.

Note that the other configurations and operations of the digitizing device according to the third embodiment are the same as those explained in the first embodiment or the second embodiment. Therefore, the explanations of the other configurations and operations of the digitizing device according to the third embodiment will be omitted. However, the sensing members being used in the ODMR and the OPAM are those in which a quantum state changes depending on the electric field and in which an electric field can be measured in the same or a similar measurement sequence.

Note that various changes and modifications to the embodiments described above will be apparent to one having ordinally skill in the art. Such the changes and modifications may be made without departing from the spirit and scope e of the subject matter and without diminishing the intended advantages. That is, it is intended that such the changes and modifications are included within the scope of the claims.

For instance, in the first to third embodiments, the measurement method in the sensor body 21 is not limited to the above-mentioned ODMR and OPAM. As long as being a measure method in which a quantum operation with respect a sensing member is performed by using the sensing member according to a physical field and it is capable of detecting observation light according to the physical field strength, any other measurement methods may be used.

Further, in the first to third embodiments, a predetermined arithmetic processing with respect to the output signals may be performed so that the values (digital values) of the output signals coincident with the levels of the input signals.

Furthermore, in the second and third embodiments, it is also possible that the difference between the detection signals obtained by the plurality of photoelectric elements 22 in the OPAM measurement sequence is generated by a differential amplifier and is outputted as a single sensor signal, and that the sensor signal is digitized by the A/D converter 3.

INDUSTRIAL APPLICABILITY

The present invention can be applicable to, for instance, the analog/digital conversion for a minute signal.

The invention claimed is:
1. A digitizing device comprising:
a physical field generator that generates a magnetic field or an electric field corresponding to an input signal;

an optical quantum sensor part that generates light corresponding to the magnetic field or the electric field by a sensing member and converts the light into an electrical signal as a sensor signal by a photoelectric element; and an analog/digital converter that digitizes the sensor signal to generate a digital signal as an output signal corresponding to the input signal, wherein the optical quantum sensor part performs a quantum operation with respect to the sensing member and causes the sensing member to generate the light corresponding to the magnetic field or the electric field, and a predetermined arithmetic processing with respect to the output signal is performed so that a value of the output signal is coincident with a level of the input signal.

2. The digitizing device according to claim 1, wherein the optical quantum sensor part causes the sensing member to generate the light as a level of the sensor signal exceeds a noise floor of the analog/digital converter.

3. The digitizing device according to claim 1, wherein an amplifier circuit in which the sensor signal is amplified is not provided between the photoelectric element and the analog/digital converter.

4. The digitizing device according to claim 1, wherein the optical quantum sensor part performs the quantum operation with respect to the sensing member according to an optically detected magnetic resonance measuring method or an optically pumped atomic magnetic force measurement method, and causes the sensing member to generate the light corresponding to the magnetic field or the electric field.

5. A digitizing method comprising:

a step of generating a magnetic field or an electric field corresponding to an input signal;

an optical quantum sensing step of generating light corresponding to the magnetic field or the electric field by a sensing member and converting the light into an electrical signal as a sensor signal by a photoelectric element; and a step of digitizing the sensor signal via an analog/digital converter to generate a digital signal as an output signal corresponding to the input signal, wherein, in the optical quantum sensing step, the sensing member is caused to generate the light corresponding to the magnetic field or the electric field by performing a quantum operation with respect to the sensing member, and a predetermined arithmetic processing with respect to the output signal is performed so that a value of the output signal is coincident with a level of the input signal.

\* \* \* \* \*